(12) United States Patent
Bailey et al.

(10) Patent No.: US 11,399,152 B2
(45) Date of Patent: Jul. 26, 2022

(54) MOCA SPLITTER DEVICE

(71) Applicant: PPC BROADBAND, INC., East Syracuse, NY (US)

(72) Inventors: Paul Bailey, Camillus, NY (US); Erdogan Alkan, Manlius, NY (US); Thomas Hart, Fayetteville, NY (US)

(73) Assignee: PPC BROADBAND, INC., East Syracuse, NY (US)

( * ) Notice: Subject to any disclaimer, the term of this patent is extended or adjusted under 35 U.S.C. 154(b) by 0 days.

(21) Appl. No.: 17/165,776

(22) Filed: Feb. 2, 2021

(65) Prior Publication Data

US 2021/0243406 A1    Aug. 5, 2021

Related U.S. Application Data

(60) Provisional application No. 62/969,386, filed on Feb. 3, 2020.

(51) Int. Cl.
*H04N 7/10* (2006.01)
*H03H 7/06* (2006.01)
(Continued)

(52) U.S. Cl.
CPC ............. *H04N 7/104* (2013.01); *H01P 1/213* (2013.01); *H01P 5/12* (2013.01); *H03H 7/06* (2013.01); *H03H 7/46* (2013.01); *H03H 7/482* (2013.01)

(58) Field of Classification Search
CPC ... H01P 1/213; H01P 5/12; H01P 5/19; H03H 7/06; H03H 7/46; H03H 7/482; H04N 7/104
See application file for complete search history.

(56) References Cited

U.S. PATENT DOCUMENTS 4,595,891 A * 6/1986 Cronauer .................. H01P 5/12
333/127
4,916,410 A * 4/1990 Littlefield ............... H03F 3/602
333/127
(Continued)

FOREIGN PATENT DOCUMENTS

CN         213905574 U  *  8/2021
WO       2019070283 A1     4/2019

OTHER PUBLICATIONS

Antone et al., "Modeling the Channel Capacity for Different Generations of In-Home Data Transmission Systems", IEEE, 2012, retrieved on May 4, 2021, https://ieeexplore.ieee.org/document/6237714, 6 pages.
(Continued)

*Primary Examiner* — Stephen E. Jones
*Assistant Examiner* — Kimberly E Glenn
(74) *Attorney, Agent, or Firm* — MH2 TECHNOLOGY LAW GROUP LLP

(57) ABSTRACT

A MoCA splitter device may include an input port, a first output port and a second output port, a first transmission line configured to connect the input port to the first output port, a second transmission line configured to connect the input port to the first output port, a first isolation element configured to connect the first transmission line to the second transmission line, a second isolation element configured to connecting the first transmission line to the second transmission line. The first isolation element and the second isolation element are configured to provide an isolation level between the first output port and the second output port that is less than a predetermined isolation level of about less than 16 dB in a MoCA frequency band.

29 Claims, 8 Drawing Sheets

(51) Int. Cl.
*H03H 7/48* (2006.01)
*H01P 1/213* (2006.01)
*H01P 5/12* (2006.01)
*H03H 7/46* (2006.01)

(56) References Cited

U.S. PATENT DOCUMENTS

| | | | |
|---|---|---|---|
| 6,489,859 B1 * | 12/2002 | Tahara | H01P 5/16 |
| | | | 333/120 |
| 7,489,283 B2 * | 2/2009 | Ingram | H01Q 21/0087 |
| | | | 342/371 |
| 2016/0094890 A9 | 3/2016 | Shapson et al. | |
| 2016/0261901 A1 | 9/2016 | Petrovic et al. | |
| 2018/0205910 A1 | 7/2018 | Li et al. | |
| 2019/0222801 A1 | 7/2019 | Barany et al. | |

OTHER PUBLICATIONS

Blaine R. Copenheaver (Authorized Officer), International Search Report and Written Opinion dated Apr. 22, 2021, PCT Application No. PCT/US2021/016250, 8 pages.

* cited by examiner

MOCA SPLITTER DEVICE

CROSS-REFERENCE TO RELATED APPLICATION

This application claims priority to U.S. Provisional Patent Application, 62/969,386, which was filed on Feb. 3, 2020, and is incorporated herein by reference in its entirety.

BACKGROUND

A Wilkinson circuit (also referred to as a power divider) is a type of circuit that can achieve certain types of isolation between output ports. It also can be used as a power combiner because it is made up of passive components as well as in other applications because of the lower attenuation and isolation in the higher frequency spectrum relative to that of ferrite-based splitters.

However, conventional Wilkinson splitters and other types of splitters, such as ferrite-based splitters, often suffer from excessive isolation levels between the output ports. Additionally, conventional Wilkinson splitters and other types of splitters, such as ferrite-based splitters, may have non-uniform levels of isolation between the different output ports. This may lead to excessive noise on the output signals or inconsistent network reliability.

Furthermore, conventional ferrite-based splitters and other types of splitters, such as resistive splitters, may have a high level of insertion loss. This may result in degradation of the signal at the output ports. Accordingly, an improved MoCA splitter with improved isolation between the output ports and improved insertion loss would be useful.

SUMMARY

A MoCA splitter device may include an input port, a first output port and a second output port, a first transmission line configured to connect the input port to the first output port, a second transmission line configured to connect the input port to the first output port, a first isolation element configured to connect the first transmission line to the second transmission line, a second isolation element configured to connecting the first transmission line to the second transmission line. The first isolation element and the second isolation element are configured to provide an isolation level between the first output port and the second output port that is less than a predetermined isolation level of about less than 16 dB in a MoCA frequency band.

In some embodiments, the first isolation element and the second isolation element are configured to provide an insertion loss between the input port and the output ports that is less than a predetermined insertion loss level. In some embodiments, a type and a value of the first isolation element and a type and a value of the second isolation element are selected to configure the isolation level between each of the output ports.

In some embodiments, a MoCA splitter device may include an input port, a plurality of output ports, a plurality of splitters configured to be connected between the input port and the output ports, wherein each splitter comprises a first transmission line, a second transmission line, a first isolation element configured to be connected between the first transmission line and the second transmission line, and a second isolation element configured to be connected between the first transmission line and the second transmission line, wherein the second isolation element is located downstream from the first isolation element, wherein the splitter device comprises a multi-stage splitter device, wherein the splitter device comprises a Microstrip splitter device, wherein the splitter device includes a Wilkinson circuit configuration, wherein the first isolation element and the second isolation element are configured to provide an isolation level between each of the output ports of less than a predetermined isolation level in a MoCA frequency band, wherein the first isolation element and the second isolation element are configured to provide an insertion loss between the input port and each of the output ports of less than a predetermined insertion loss level, wherein the first isolation element and the second isolation element are configured to provide a substantially uniform isolation level between the input port and each of the output ports, wherein the predetermined isolation level is about 16 dB or less, wherein the MoCA frequency band is 1125-1675 MHz, wherein the predetermined insertion loss level is about 4 dB or less per cascaded splitter, wherein a type and a value of the first isolation element and a type and a value of the second isolation element are selected to configure the isolation level between each of the output ports, wherein the type and the value of the first isolation element and the type and the value of the second isolation element are selected to configure the insertion loss between the input port and each of the output ports, and wherein the type and the value of the first isolation element and the type and the value of the second isolation element are selected to configure the substantially uniform isolation level between the input port and each of the output ports.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures.

DETAILED DESCRIPTION

Figure 1:
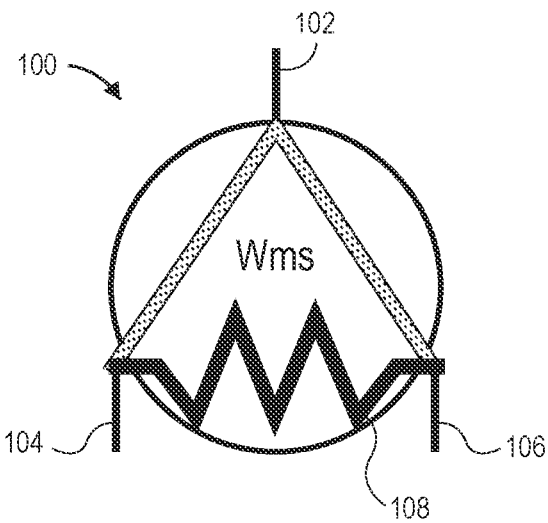
FIG. 1 illustrates a schematic view of a two-way, one-stage splitter device in accordance with aspects of the present disclosure.

The present disclosure relates to a splitter device. More particularly, the present disclosure relates to a micro-strip MoCA splitter device that includes an N-way reactive micro-strip design that improves the thermal behavior, insertion loss, and isolation in the MoCA frequency band (e.g., 1125 MHz-1675 MHz) when compared to conventional reactive toroidal splitters and conventional resistive splitters.

In one embodiment, the splitter may be a two-stage, four-way splitter with a thickness of about 39 mil such that the splitter is tuned for the MoCA frequency band. For two-stage and three-stage, two-way splitters, additional bandwidth may be achieved to operate in the 900 MHz-3000 MHz frequency band as well as fair performance in the 50 MHz-900 MHz frequency band.

In another embodiment, the splitter device may be or include a two-way splitter that includes a two-stage micro-strip splitter design. The splitter device may be made from a glass-reinforced epoxy laminate material such as FR4 and be about 39 mil thick. The first stage and/or the second stage may have a width from about 5 mil to about 20 mil (e.g., about 10 mil), and a length from about 1000 mil to about 2000 mil (e.g., about 1400 mil). The splitter device also may include one or more isolation elements, which may be resistors, capacitors inductors or a combination thereof. For example, the splitter device may include a first resistor having a resistance from about 100 ohms to about 300 ohms (e.g., about 200 ohms), and a second resistor having a resistance from about 300 ohms to about 500 ohms (e.g., about 400 ohms). The splitter device may have an insertion loss in the MoCA frequency band that is less than about 4.8 dB, less than about 3.8 dB, or less than about 2.8 dB. The splitter device may have an isolation in the MoCA frequency band that is less than about 20 dB, less than about 16 dB, or less than about 12 dB.

In another embodiment, the splitter device may be or include a four-way splitter that includes three, two-stage micro-strip splitters. The splitter device may be made from FR4 and be about 39 mil thick. The first stage and/or the second stage each splitter may have a width from about 5 mil to about 20 mil (e.g., about 10 mil), and a length from about 1000 mil to about 2000 mil (e.g., about 1400 mil). One or more of the splitters may also include resistors. For example, the first splitter may include 0 ohm resistors. The second and third splitters may each include two higher value resistors. The first resistor of the second splitter and/or the third splitter may have a resistance from about 100 ohms to about 300 ohms (e.g., about 200 ohms), and the second resistor of the second splitter and/or the third splitter may have a resistance from about 300 ohms to about 500 ohms (e.g., about 400 ohms). The first splitter may be connected to the second and third splitters using intermediate transmission lines having a width from about 25 mil to about 40 mil (e.g., about 32 mil). The splitter device may have an insertion loss in the MoCA frequency band that is less than about 12 dB, or less than about 8 dB. The splitter device may have an isolation in the MoCA frequency band that is less than bout 20 dB, less than about 16 dB, or less than about 12 dB. The splitter device may have a return loss in the MoCA frequency band that is greater than about 8 dB, greater than about 10 dB, or greater than about 12 dB. The micro-strip tracks may be on the top side or the bottom side of the printed circuit board (PCB). The resistors may be mounted on the same side or an opposite side of the PCB micro-strip tracks.

In another embodiment, the splitter device may be or include an eight-way splitter that includes seven, two-stage micro-strip splitters. The splitter device may be made from a glass-reinforced epoxy laminate material such as FR4 and may be about 39 mil thick. The first stage and/or the second stage each splitter may have a width from about 5 mil to about 20 mil (e.g., about 10 mil), and a length from about 1000 mil to about 2000 mil (e.g., about 1400 mil). One or more of the splitters may include resistors. For example, the first splitter, the second splitter, and the fifth splitter may include 0 ohm resistors. The third splitter, the fourth splitter, the sixth splitter, and the seventh splitter may each include two higher value resistors. The first resistor of the third splitter, the fourth splitter, the sixth splitter, and/or the seventh splitter may have a resistance from about 100 ohms to about 300 ohms (e.g., about 200 ohms), and the second resistor of the third splitter, the fourth splitter, the sixth splitter, and/or the seventh splitter may have a resistance from about 300 ohms to about 500 ohms (e.g., about 400 ohms). The splitters may be connected using intermediate transmission lines having a width from about 25 mil to about 40 mil (e.g., about 32 mil). The splitter device may have an insertion loss in the MoCA frequency band that is less than about 16 dB, or less than about 12 dB. The splitter device may have an isolation in the MoCA frequency band that is less than bout 20 dB, or less than about 16 dB.

FIG. 1 illustrates a schematic view of a two-way, one-stage micro-strip splitter device 100 according to an embodiment. The micro-strip splitter device 100 includes an input port 102, a first output port 104 and a second output port 106. First and second transmission lines connect the input port to the first and second output ports, respectively. A resistor 108 is connected between the first and second transmission lines. The transmission lines may be ¼ wave transmission lines, for example.

Figure 2:
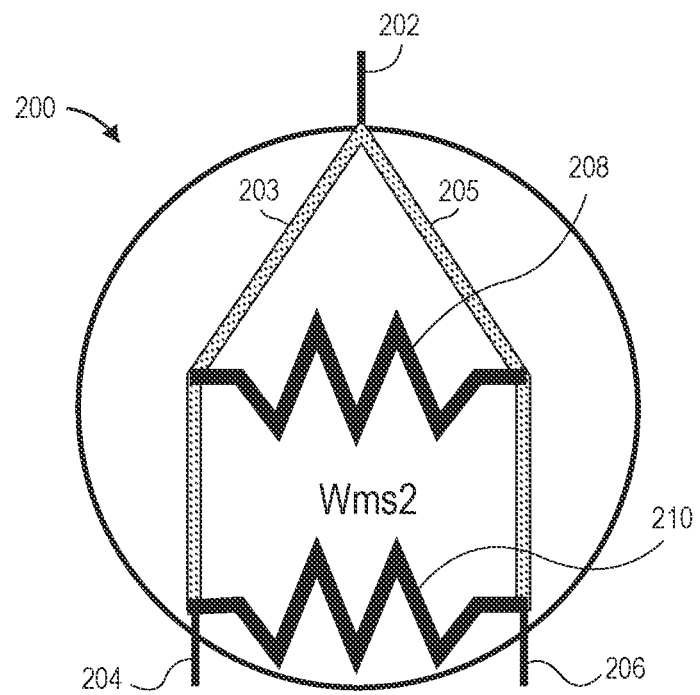
FIG. 2 illustrates a schematic view of a two-way, two-stage splitter device in accordance with aspects of the present disclosure.

FIG. 2 illustrates a schematic view of a two-way, two-stage micro-strip splitter device 200 according to other exemplary embodiments of the disclosure. The two-way, two-stage micro-strip splitter device 200 includes a first transmission line 203 connecting an input port 202 to a first output port 204 and a second transmission line 205 connecting the input port 202 to a second output port 206. A first isolation element 208 is connected between the first transmission line 203 and the second transmission line 205. A second isolation element 210 is connected between the first transmission line 203 and the second transmission line 205, with the second isolation element 210 being positioned downstream (closer to the output ports 204, 206) than the first isolation element 208. The isolation elements 208, 210 may be resistors. In some embodiments, the isolation element 208 may be a resistor having a resistance of about 100 ohms to about 300 ohms (e.g., about 200 ohms), and the isolation element 210 may be a resistor having a resistance of about 300 ohms to about 500 ohms (e.g., about 400 ohms). The isolation elements 208, 210 may have values (such as resistance values) that are set to provide a predetermined isolation level and/or a predetermined insertion loss, as further explained herein. In some embodiments, the splitter device 200 of FIG. 2 (and the other splitter devices disclosed herein) may be a Wilkinson splitter device. A Wilkinson Splitter differentiates itself from other splitters by establishing it's frequency or operation and impedance matching within the transmission line construction via line length and width while providing very low insertion loss and isolation at the frequency band of interest.

Figure 3:
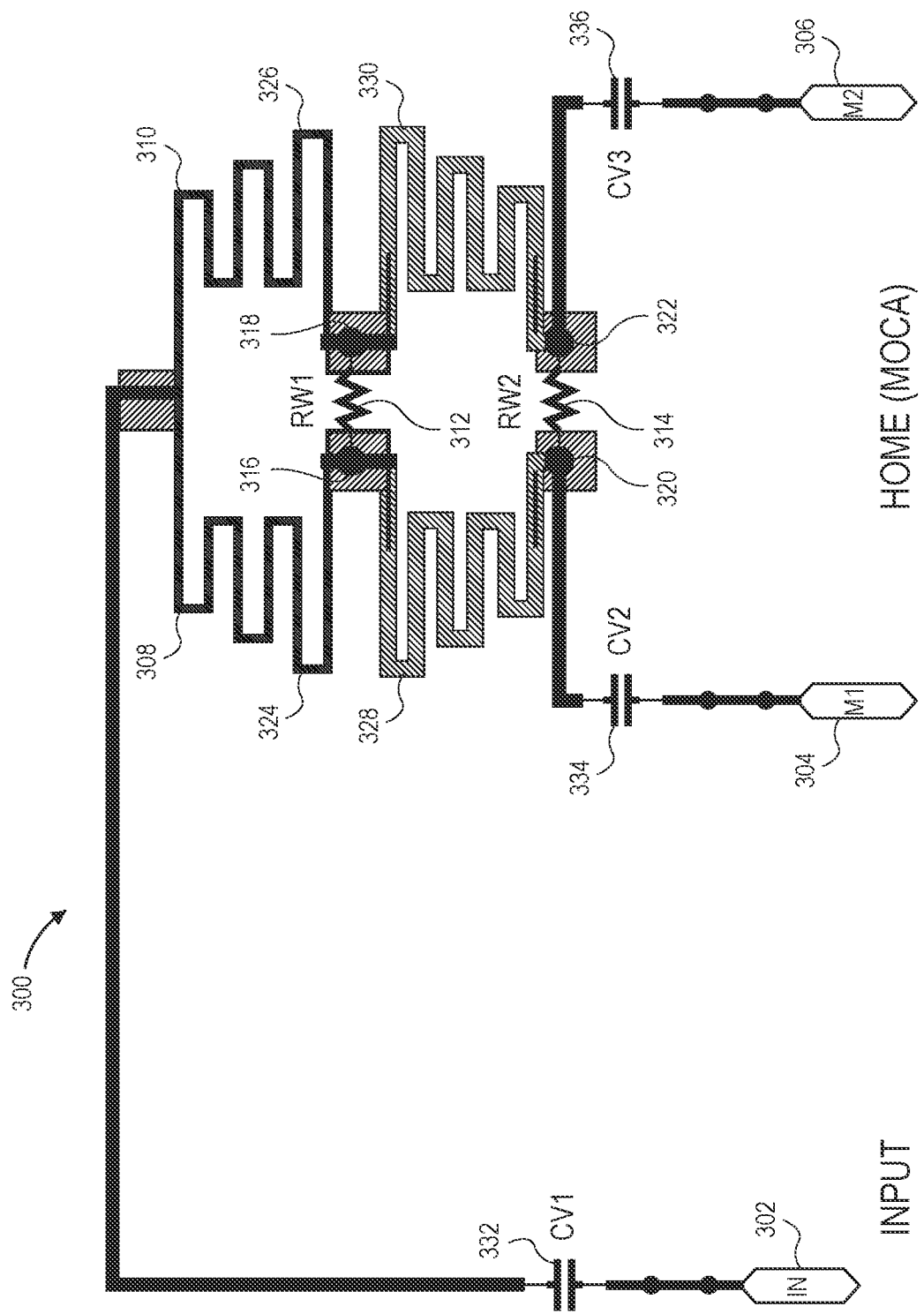
FIG. 3 illustrates a schematic view of a two-way splitter device in accordance with aspects of the present disclosure.

FIG. 3 illustrates a schematic view of a two-way, two-stage micro-strip splitter device 300 according to embodiments of the disclosure. The splitter device 300 may have an input port 302, a first output port 304 and a second output port 306. A first transmission line 308 may connect the input port 302 to the first output port 304 and a second transmission line 310 may connect the input port 302 to the second output port 306. A first isolation element 312 may connect the first transmission line 308 to the second transmission line 310 at positions 316 and 318. A second isolation element 314 may connect the first transmission line 308 to the second transmission line 310 at positions 320 and 322, and the second isolation element 314 may be positioned downstream (closer to the output ports 304, 306 than the first isolation element 312.

The first isolation element 312 may be connected to the first and second transmission lines 308, 310 between a first portion 324 and a second portion 328 of the first transmission line and between a first portion 326 and a second portion 330 of the second transmission line 310. The second isolation element 314 may be connected to the first and second transmission lines 308, 310 between the second portion 328 and the output port 304 and between the second portion 330 and the output port 306. Capacitors 332, 334 and 336 may be positioned along the transmission lines between the ports. As in the embodiment of FIG. 2, the isolation elements 312, 314 may have values (such as resistance values) that are set to provide a predetermined isolation level and/or a predetermined insertion loss, as further explained herein.

Figure 4:
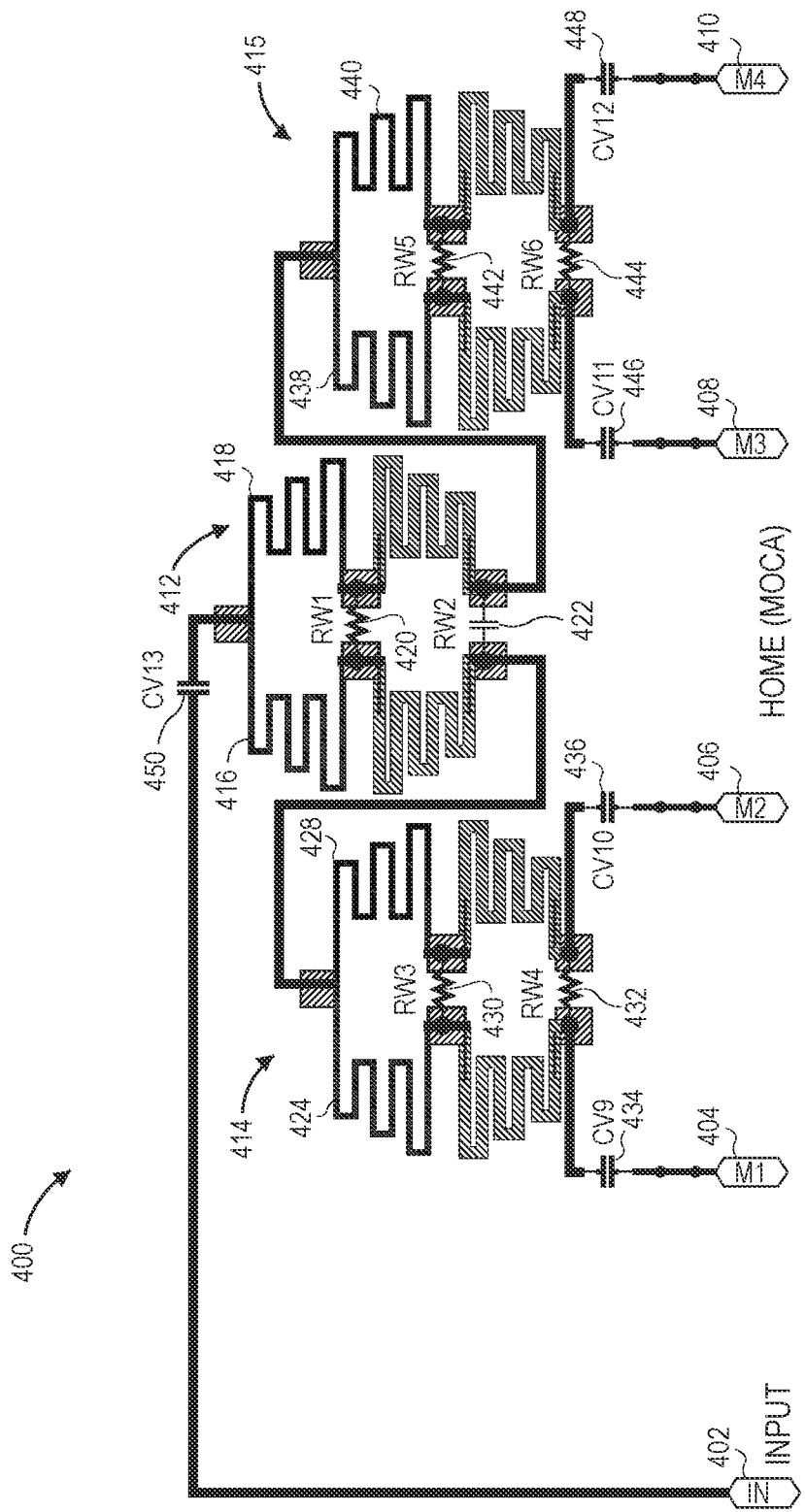
FIG. 4 illustrates a schematic view of a four-way, two-stage splitter device in accordance with aspects of the present disclosure.

FIG. 4 illustrates a schematic view of an four-way, two-stage micro-strip splitter device 400, according to embodiments of the disclosure. The splitter device 400 has an input port 402 and four output ports 404, 406, 408 and 410. The splitter device 400 also includes a first splitter 412, a second splitter 414 and a third splitter 415. The first splitter 412, the second splitter 414 and the third splitter 415 each include a first transmission line 416, 424, 438 and a second transmission line 418, 428, 440, as well as a first isolation element 420, 430, 442 and a second isolation element 422, 432, 444 connected between the respective first and second transmission lines. Capacitors 434, 436, 446, 448 and 450 may be connected at various locations between the input port 402 and the output ports 404, 406, 408, 410.

Figure 5:
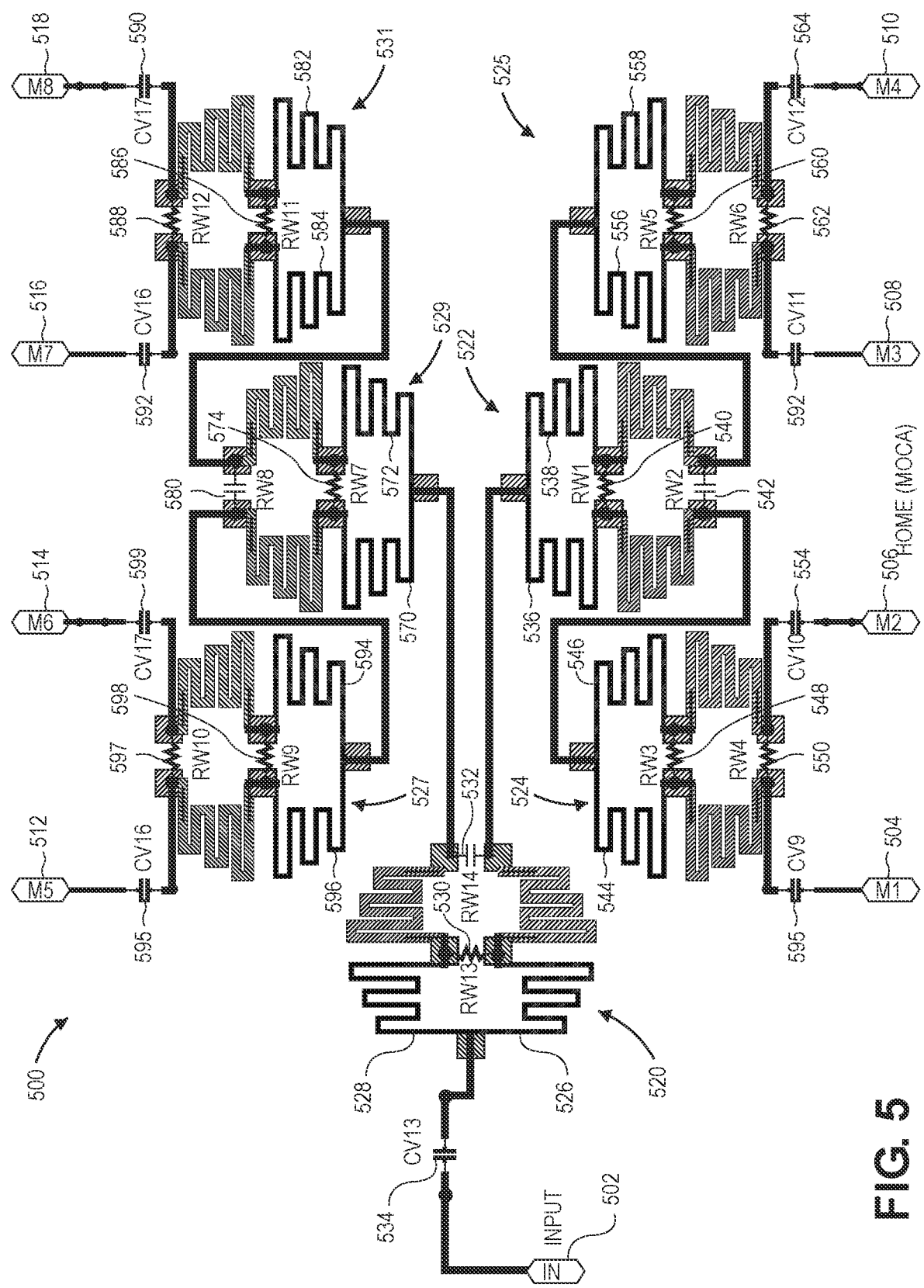
FIG. 5 illustrates a schematic view of an eight-way, two-stage splitter device in accordance with aspects of the present disclosure.

FIG. 5 illustrates a schematic view of an eight-way, two-stage micro-strip splitter device 500 according to embodiments of the disclosure. The splitter device 500 may have an input port 502 and eight output ports 504, 506, 508, 510, 512, 514, 516 and 518. The splitter device also includes seven splitters 520, 522, 524, 525, 527, 529 and 531 configured to split and incoming signal received at the input port 502 into eight output signals configured to be output at the eight output ports 504, 506, 508, 510, 512, 514, 516 and 518. In some embodiments, the splitter device 500 is configured to split a signal received at the input port 502 into eight output signals at the output ports. In some embodiments, the output signals may be MoCA signals.

The splitters 520, 522, 524, 525, 527, 529 and 531 each include a first transmission line 526, 536, 544, 556, 572, 582 and 594 and a second transmission line 528, 538, 546, 558, 570, 584 and 596. Additionally, the splitters 520, 522, 524, 525, 527, 529 and 531 each include first isolation elements 530, 540, 548, 560, 574, 586 and 598 and second isolation elements 532, 542, 550, 562, 580, 588 and 597 connected between the respective first and second transmission lines of the respective splitters. The isolation elements may have values (such as resistance values) that are set to provide a predetermined isolation level and/or a predetermined insertion loss, as further explained herein.

In at least some of the embodiments, the isolation elements may be resistors, capacitors, inductors or a combination thereof. In some embodiments, the isolation elements are selected to substantially equalize the isolation between the input port and each of the output ports. For example, in some embodiments, the isolation elements are selected so that the isolation levels between the input port and each of the output ports is less than a predetermined isolation level. In some embodiments, the isolation elements are selected to provide an insertion loss between the input port and each of the output ports that is less than a predetermined insertion loss level.

Figure 6:
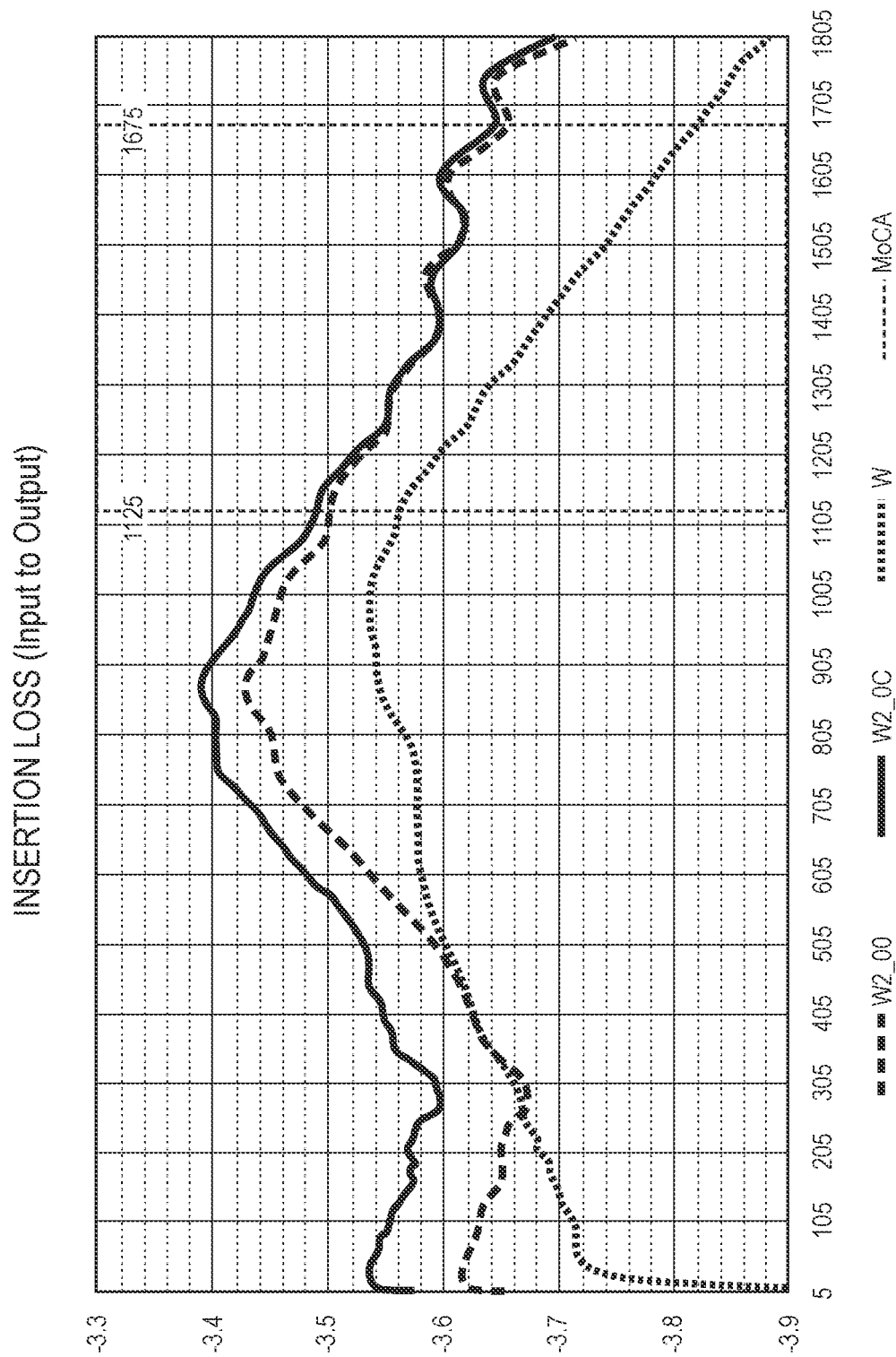
FIG. 6 illustrates a graph showing input to MoCA insertion loss of a two-way splitter device in accordance with aspects of the present disclosure.

FIG. 6 illustrates a graph showing input to MoCA insertion loss of a two-way micro-strip splitter device with three different combinations of isolation elements, one with a first isolation element 312 being a resistor RW1=200 Ohms and a second isolation element 314 being a resistor with RW2=400 Ohms, another one with the first isolation element being a resistor having a resistance RW1=0 Ohms and the second isolation element being a resistor with a resistance of RW2=0 Ohms, and another one with the first isolation element 312 being a resistor with a resistance RW1=0 Ohms and the second isolation element being a capacitor with a capacitance of 4.7 pF, according to some embodiments. The insertion loss is less than about 4 dB across the MoCA frequency band (1125-1675 MHz), which may be a predetermined insertion loss level. This insertion loss level is far better than a typical resistive splitter, which may have an insertion loss of 6-8 dB.

Figure 7:
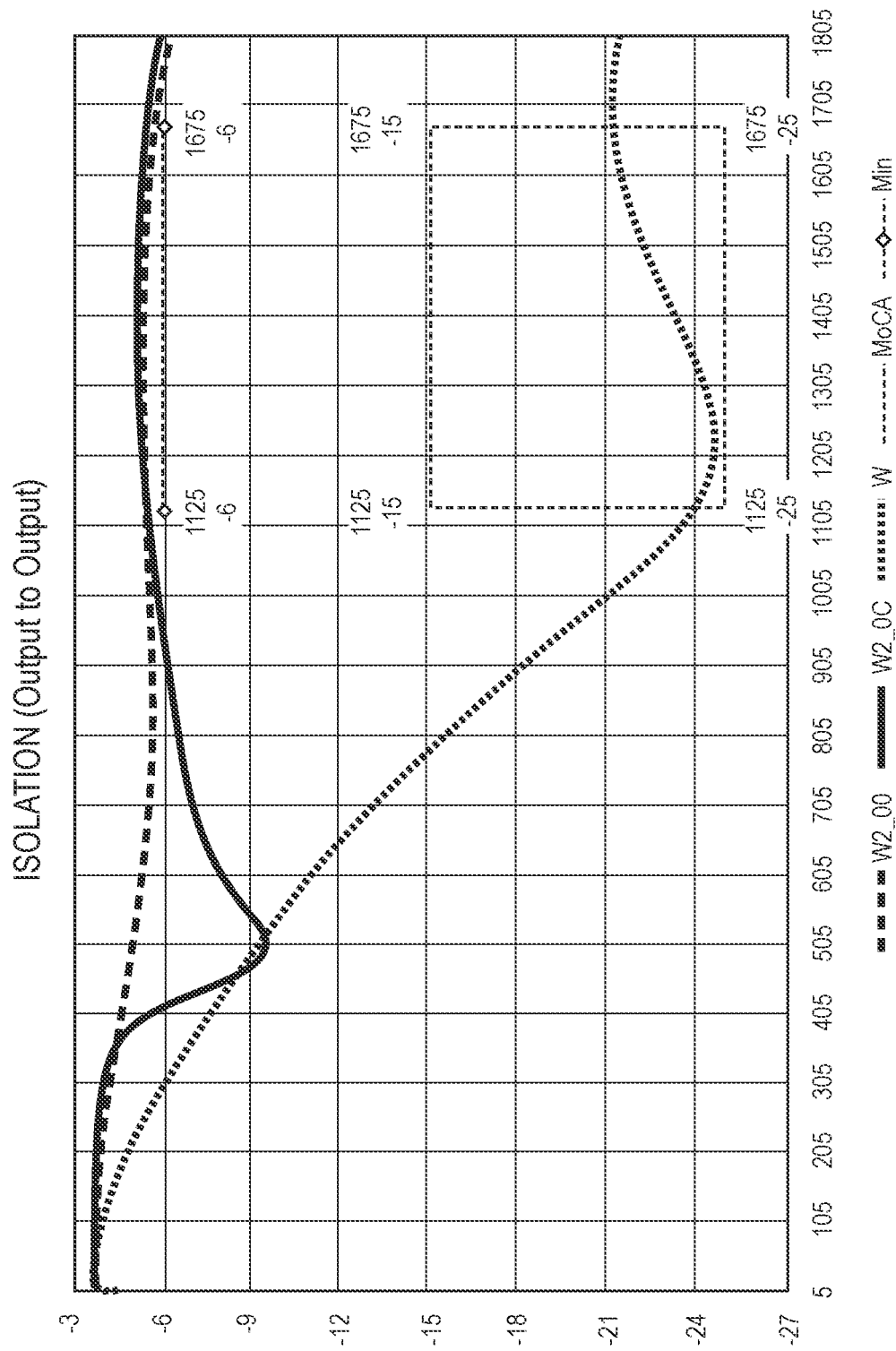
FIG. 7 illustrates a graph showing output to output isolation of the two-way splitter device in accordance with aspects of the present disclosure.

FIG. 7 illustrates a graph showing MoCA-MoCA isolation between the output ports 304, 306 of the two-way micro-strip splitter device 300 with three combinations of isolation elements, one with the first isolation element 312 having a resistance RW1=200 Ohms and the second isolation element 314 having a resistance RW2=400 Ohms, another one with the first isolation element 312 having a resistance RW1=0 Ohms and the second isolation element 314 having a resistance RW2=0 Ohms, and another one with the first isolation element 312 being a resistor with a resistance of with RW1=0 Ohms and the second isolation element 314 being a capacitor with a capacitance of 4.7 pF, according to some embodiments.

With the first isolation element 312 having a resistance RW=200 Ohms and the second isolation element 314 having a resistance RW2=400 Ohms, the result of greater than 16 dB isolation may be high for MoCA applications. With the first isolation element 312 having a resistance RW1=0 Ohms and the second isolation element 314 having a resistance RW2=0 Ohms, the result may be an isolation less than 6 dB across the MoCA frequency band, which may be low for MoCA applications. A nominal isolation for MoCA application may be in the range of about 10-16 dB. With the first isolation element 312 being a resistor with a resistance of with RW1=0 Ohms and the second isolation element 314 being a capacitor with a capacitance of 4.7 pF, the result may be the capacitance aiding in flattening the response between ports but still results in an isolation of less than 6 dB. 6 dB is too low for a standalone 2-way MoCA splitter but may produce excellent results when configured as an intermediate splitter within a 4-way or 8-way splitter maintaining a substantially uniform port to port isolation in the range of 10 to 16 dB, for example.

Figure 8:
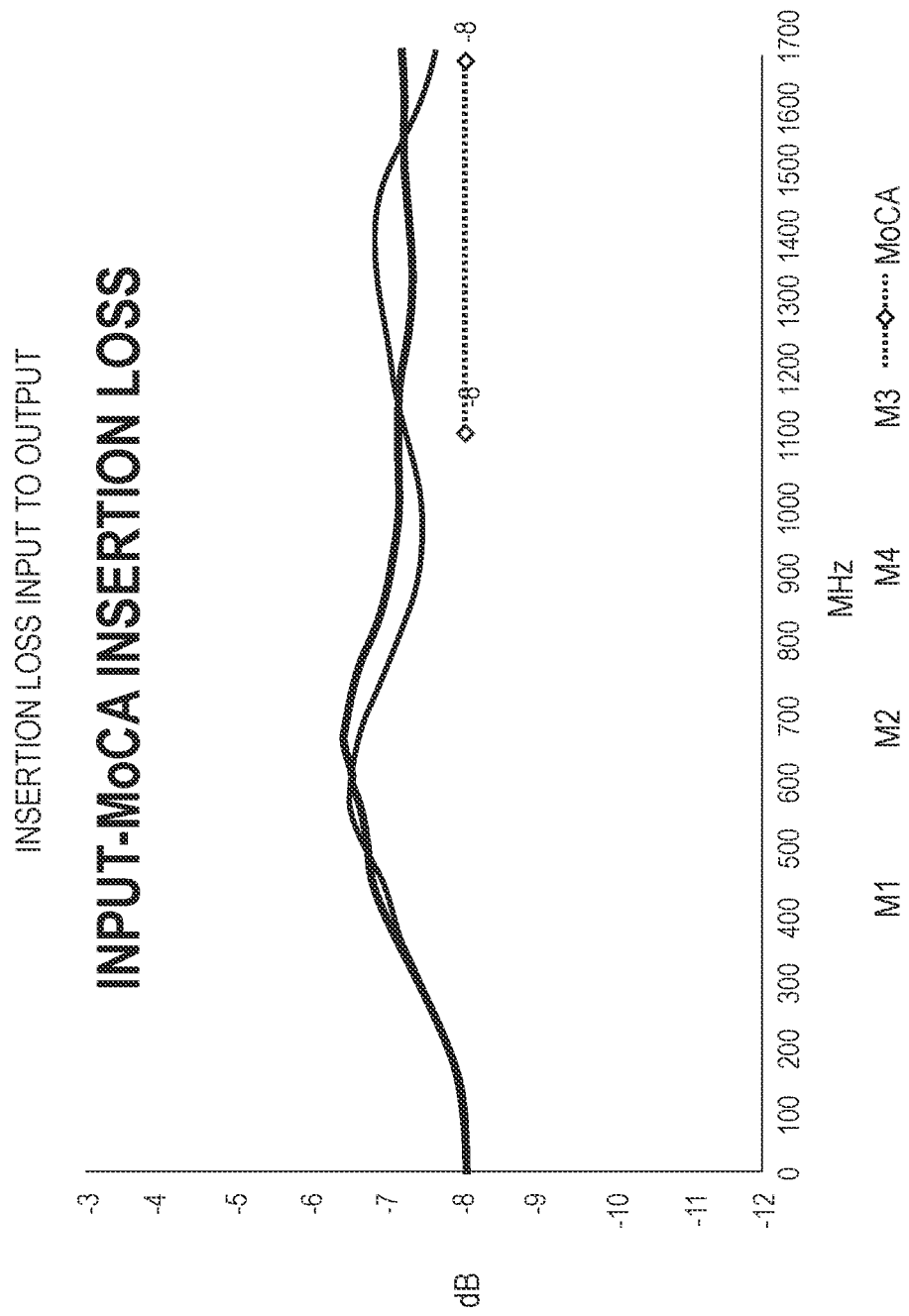
FIG. 8 illustrates a graph showing input to MoCA insertion loss of the four-way micro-strip splitter device in accordance with aspects of the present disclosure.

FIG. 8 illustrates a graph showing input to MoCA insertion loss of the four-way micro-strip splitter device 300 with the first isolation element 312 being a resistor with a resistance of RW1=200 Ohms and the second isolation element 314 being a resistor with a resistance of RW2=400 Ohms, according to an embodiment. This example results in an input return loss of less than about 8 dB. This result is far better than a typical resistive splitter, which may have an insertion loss of 12.5-16 dB.

Figure 9:
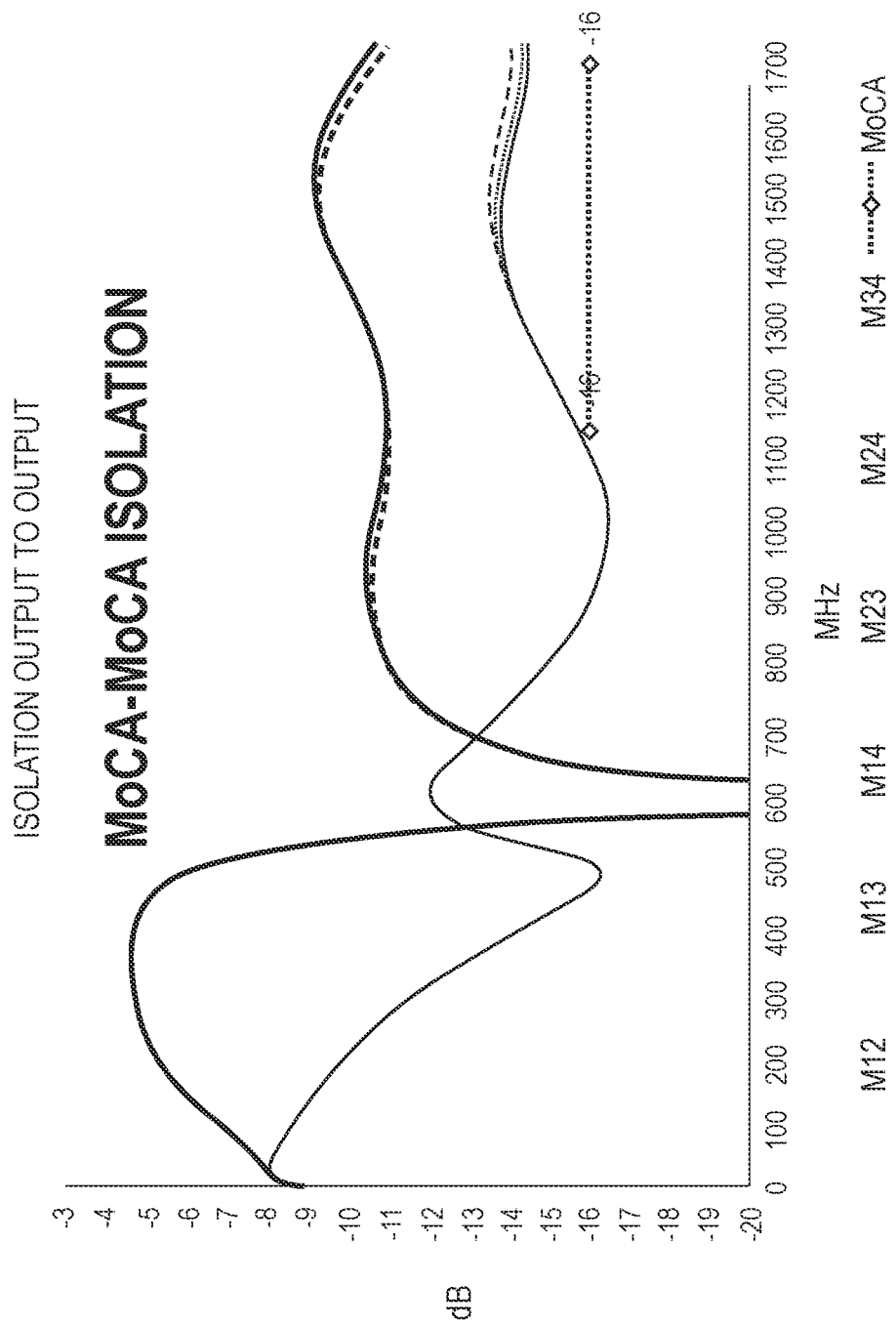
FIG. 9 illustrates a graph showing output to output isolation of the four-way splitter device in accordance with aspects of the present disclosure.

FIG. 9 illustrates a graph showing MoCA-MoCA isolation of the four-way, two-stage micro-strip splitter device 400 with the first isolation element 420 being a nominal value resistance of 100-200 Ohms and the second isolation element 422 being a capacitor with a capacitance of 4.7 pF according to an embodiment. The outward most splitters 414, 415 may have nominal isolation element resistance values such as 200 ohm and 400 ohms to work in combination with reduced isolation of the intermediate splitter 412 to achieve a uniform port to port MoCA isolation in the range of 10-16 dB.

This example provides output port to output port isolation of 10-16 dB across the MoCA frequency band. The isolation level (as well as the insertion loss and uniformity of the isolation level between the output ports) can be adjusted by changing one or more of the isolation elements by value or type. For example, the isolation elements can be various type, such as resistors, capacitors, inductors, or any combination thereof. The value (resistance, capacitance, inductance) of the resistors, capacitors and/or inductors can be changed as need to provide the isolation level, insertion loss and uniformity of the isolation level between the output ports. Adjusting the resistance values of the isolation elements in the outer-most splitters to a range of 10-16 dB between adjacent ports then reducing the MoCA isolation of the intermediate splitter by dropping the resistance close to zero and or replacing with a capacitor or any combination of RC, LC or RLC will balance the distant port to port MoCA isolation to the same 10-16 dB range.

As described herein, embodiments of the disclosed micro-strip splitter devices include one or more splitters with isolation elements that may be selected to provide predetermined levels of isolation between the output ports and predetermined levels of input port to output port insertion loss.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims. The present disclosure is not to be limited in terms of the particular embodiments described in this application, which are intended as illustrations of various aspects. Many modifications and variations can be made without departing from its spirit and scope, as will be apparent to those skilled in the art. Functionally equivalent apparatuses within the scope of the disclosure, in addition to those enumerated herein will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." In addition, where features or aspects of the disclosure are described in terms of Markush groups, those skilled in the art will recognize that the disclosure is also thereby described in terms of any individual member or subgroup of members of the Markush group.

What is claimed is:

1. A MoCA splitter device, comprising:
an input port;

a plurality of output ports;
a plurality of splitters configured to be connected between the input port and the output ports;
wherein each splitter comprises a first transmission line, a second transmission line, a first isolation element configured to be connected between the first transmission line and the second transmission line, and a second isolation element configured to be connected between the first transmission line and the second transmission line;
wherein the second isolation element is located downstream from the first isolation element;
wherein the splitter device comprises a multi-stage splitter device;
wherein the splitter device comprises a Microstrip splitter device;
wherein the splitter device includes a Wilkinson circuit configuration;
  wherein the first isolation element and the second isolation element are configured to provide an isolation level between each of the output ports of less than a predetermined isolation level in a MoCA frequency band;
  wherein the first isolation element and the second isolation element are configured to provide an insertion loss between the input port and each of the output ports of less than a predetermined insertion loss level;
  wherein the first isolation element and the second isolation element are configured to provide a substantially uniform isolation level between each of the output ports;
  wherein the predetermined isolation level is about 16 dB or less;
  wherein the MoCA frequency band is 1125-1675 MHz;
  wherein the predetermined insertion loss level is about 8 dB or less;
  wherein a type and a value of the first isolation element and a type and a value of the second isolation element are selected to configure the isolation level between each of the output ports;
  wherein the type and the value of the first isolation element and the type and the value of the second isolation element are selected to configure the insertion loss between the input port and each of the output ports; and
  wherein the type and the value of the first isolation element and the type and the value of the second isolation element are selected to configure the substantially uniform isolation level between each of the output ports.

2. The splitter device of claim 1, wherein the first isolation element and the second isolation element are each resistors, and each of the resistors have a resistance of about 200 Ohms or less and 400 Ohms or less, respectively.

3. The splitter device of claim 1, wherein the first isolation element is a resistor having a resistance of 200 Ohms or less and the second isolation element is a capacitor having a capacitance of about 6.8 pf or less.

4. The splitter device of claim 1, wherein the plurality of splitters comprise three splitters, the plurality of output ports comprise four output ports, and the second isolation element in one of the splitters is a different type of isolation element than the second isolation element in the other splitters.

5. The splitter device of claim 1, wherein the plurality of splitters comprise seven splitters, the plurality of output ports comprise eight output ports, and the second isolation element in three of the splitters is a different type of isolation element than the second isolation element in the other splitters.

6. A MoCA splitter device comprising:
an input port;
a first output port and a second output port;
a first transmission line configured to connect the input port to the first output port;
a second transmission line configured to connect the input port to the second output port;
a first isolation element configured to connect the first transmission line to the second transmission line;
a second isolation element configured to connect the first transmission line to the second transmission line;
wherein the splitter device comprises a multi-stage splitter device;
wherein the second isolation element is located downstream from the first isolation element;
  wherein the first isolation element and the second isolation element are configured to provide an isolation level between the first output port and the second output port of less than a predetermined isolation level in a MoCA frequency band; and
  wherein the first isolation element and the second isolation element are configured to provide an insertion loss between the input port and the output port that is less than a predetermined insertion loss level; and
  wherein the predetermined isolation level is about 16 dB or less.

7. The splitter device of claim 6, wherein the splitter device comprises a Wilkinson circuit configuration and a Microstrip splitter configuration.

8. The splitter device of claim 6, wherein the predetermined MoCA frequency band is 1125-1675 MHz.

9. The splitter device of claim 6, wherein the predetermined insertion loss level is about 4 dB or less.

10. The splitter device of claim 6, wherein the first isolation element and the second isolation element are each resistors having a resistance of about 200 Ohms or less and 400 Ohms or less, respectively.

11. The splitter device of claim 6, wherein the first isolation element is a resistor having a resistance of 200 Ohms or less and the second isolation element is a capacitor having a capacitance of about 6.8 pf or less.

12. The splitter device of claim 6, wherein a type and a value of the first isolation element and a type and a value of the second isolation element are selected to configure the isolation level between each of the output ports.

13. The splitter device of claim 6, wherein a type and a value of the first isolation element and a type and a value of the second isolation element are selected to configure the insertion loss between the input port and each of the output ports.

14. A MoCA splitter device, comprising:
an input port;
a first output port and a second output port;
a first transmission line configured to connect the input port to the first output port;
a second transmission line configured to connect the input port to the second output port;
a first isolation element configured to connect the first transmission line to the second transmission line;
a second isolation element configured to connect the first transmission line to the second transmission line;
wherein the second isolation element is located downstream from the first isolation element;

wherein the first isolation element and the second isolation element are configured to provide an isolation level between the first output port and the second output port that is less than a predetermined isolation level in a MoCA frequency band; and wherein the predetermined isolation level is about 16 dB or less.

15. The splitter device of claim 14, wherein the splitter device comprises a Wilkinson circuit configuration, a multi-stage splitter configuration, and a Microstrip splitter configuration.

16. The splitter device of claim 14, wherein the MoCA frequency band is 1125-1675 MHz.

17. The splitter device of claim 14, wherein the first isolation element comprises a resistor having a resistance of about 200 Ohms or less.

18. The splitter device of claim 14, wherein the second isolation element comprises a resister having a resistance of about 400 Ohms or less.

19. The splitter device of claim 17, wherein the second isolation element is a capacitor having a capacitance of about 6.8 pf or less.

20. The splitter device of claim 14, wherein the first isolation element and the second isolation element are configured to provide an insertion loss between the input port and the output port that is less than a predetermined insertion loss level.

21. The splitter device of claim 20, wherein the predetermined insertion loss level is about 4 dB or less.

22. The splitter device of claim 14, wherein a type and a value of the first isolation element and a type and a value of the second isolation element are selected to configure the isolation level between each of the output ports.

23. A MoCA splitter device comprising:
an input port;
a first output port and a second output port;
a first transmission line configured to connect the input port to the first output port;
a second transmission line configured to connect the input port to the second output port;
a first isolation means for connecting the first transmission line to the second transmission line;
a second isolation means for connecting the first transmission line to the second transmission line;
wherein the second isolation means is located downstream from the first isolation means;
wherein the first isolation means and the second isolation means are configured for providing an isolation level between the first output port and the second output port that is less than a predetermined isolation level in a predetermined MoCA frequency band; and
wherein the predetermined MoCA frequency band is 1125-1675 MHz.

24. The splitter device of claim 23, wherein the splitter device comprises a Wilkinson circuit configuration, a multi-stage splitter configuration, and a Microstrip splitter configuration.

25. The splitter device of claim 23, wherein the predetermined isolation level is about 16 dB or less.

26. The splitter device of claim 23, wherein the first isolation means comprises a resister having a resistance of about 200 Ohms or less.

27. The splitter device of claim 23, wherein the second isolation means comprises a capacitor of about 6.8 pf or less.

28. The splitter device of claim 27, wherein the first isolation means and the second isolation means are configured for providing an insertion loss between the input port and the output port that is less than a predetermined insertion loss level.

29. The splitter device of claim 28, wherein the predetermined insertion loss level is about 4 dB or less.

* * * * *